US008288287B2

(12) United States Patent
Takata et al.

(10) Patent No.: US 8,288,287 B2
(45) Date of Patent: Oct. 16, 2012

(54) ETCHING METHOD AND ETCHING EQUIPMENT

(75) Inventors: Kazuo Takata, Kudamatsu (JP); Yutaka Kudou, Kudamatsu (JP); Satoshi Tani, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 514 days.

(21) Appl. No.: 12/054,095

(22) Filed: Mar. 24, 2008

(65) Prior Publication Data

US 2008/0176409 A1 Jul. 24, 2008

Related U.S. Application Data

(62) Division of application No. 11/288,105, filed on Nov. 29, 2005, now abandoned.

(30) Foreign Application Priority Data

Oct. 7, 2005 (JP) ................................ 2005-295462

(51) Int. Cl.
*H01L 21/302* (2006.01)

(52) U.S. Cl. ............. 438/715; 216/58; 216/63; 216/66; 438/695; 438/723; 438/728

(58) Field of Classification Search .................... 216/58, 216/63, 66; 438/715, 706, 695, 723, 728, 438/669; 252/79.1; 118/718; 136/256
See application file for complete search history.

(56) References Cited

U.S. PATENT DOCUMENTS 4,462,863 A * 7/1984 Nishimatsu et al. .......... 438/728
4,855,017 A * 8/1989 Douglas ........................ 438/695
4,992,136 A * 2/1991 Tachi et al. .................. 438/695
5,423,941 A * 6/1995 Komura et al. .............. 438/700
5,599,743 A * 2/1997 Nakagawa et al. .......... 438/669
5,874,362 A * 2/1999 Wong et al. ................... 438/719
6,071,793 A 6/2000 Peidous et al.
6,127,278 A 10/2000 Wang et al.
6,249,035 B1 6/2001 Peidous et al.
6,635,185 B2 10/2003 Demmin et al.
2001/0045354 A1* 11/2001 Wang et al. .............. 204/192.37
2004/0097079 A1* 5/2004 Mimura et al. .............. 438/689
2004/0256353 A1 12/2004 Panda et al.
2005/0014372 A1 1/2005 Shimonishi et al.
2005/0029221 A1 2/2005 Chang et al.
2006/0063385 A1 3/2006 Maruyama et al.
2006/0180571 A1 8/2006 Fujihara et al.
2006/0264054 A1* 11/2006 Gutsche et al. .............. 438/696

FOREIGN PATENT DOCUMENTS

JP 11-135489 5/1999
JP 2004-87738 3/2004

* cited by examiner

*Primary Examiner* — Duy Deo
*Assistant Examiner* — Erin Flanagan
(74) *Attorney, Agent, or Firm* — Antonelli, Terry, Stout & Kraus, LLP.

(57) ABSTRACT

The invention provides an etching method for realizing trench etching without causing any damages to the side walls of the trench while maintaining a high-etching rate. The plasma etching method relates to forming a groove or a hole by forming a silicon trench to a silicon substrate or a silicon substrate having a silicon oxide dielectric layer via a mixed gas plasma containing a mixed gas of $SF_6$ and $O_2$ or a mixed gas of $SF_6$, $O_2$ and $SiF_4$ and having added thereto a gas containing hydrogen within the range of 5 to 16% (percent concentration) of the total gas flow rate of the mixed gas.

2 Claims, 4 Drawing Sheets

Si TRENCH SIDE WALL DAMAGE QUANTITY DEPENDENCY

QUANTITY OF DAMAGE OF Si SIDE WALLS (nm)

200
160
120
80
40
0

0 10 20 30 40 50 60 70 80

ADDED FLOW RATE OF HBr (mL/min)

PRIOR TO ETCHING

AFTER ETCHING

AFTER ETCHING

LOW ASPECT SAMPLE

HIGH ASPECT SAMPLE

ETCHING METHOD AND ETCHING EQUIPMENT

The present application is based on and claims priority of Japanese patent application No. 2005-295462 filed on Oct. 7, 2005, the entire contents of which are hereby incorporated by reference. This application is a Divisional application of prior application Ser. No. 11/288,105, filed Nov. 29, 2005 now abandoned, the contents of which are incorporated herein by reference in their entirety.

BACKGROUND OF THE INVENTION

1. Field of the Invention

The present invention relates to a method and equipment for etching a semiconductor device. More specifically, the present invention relates to a method and equipment capable of preventing the side walls of a trench (groove or hole) from being damaged.

2. Description of the Related Art

Recently, silicon (Si) trench etching is applied as a device isolation technique to devices such as in-vehicle pressure-resistant IGBT (insulated gate bipolar transistor) devices corresponding to hybrid vehicles, which is drawing keen attentions in the motor vehicle industry. This method relates to electrically isolating devices by forming a deep trench via dry etching to the device isolation region of the semiconductor device, and embedding an insulating film to the formed trench via CVD (chemical vapor deposition) method or the like.

Moreover, there are active attempts to apply this Si trench to a three-dimensional mount technology, which also requires a deep trench to be formed via etching as described above.

In forming the above-mentioned trench, the depth of the hole (or groove) of the trench profile is required to be as deep as several tens of micrometers, so in order to ensure sufficient throughput, the etching must be performed at high etching rate. Fluoride-based gases having higher reactivity with Si is dominant over chlorine-based gases in the method for realizing high-rate plasma etching.

Japanese Patent Application Laid-Open Publication No. 11-135489 (patent document 1) discloses, for example, a dry etching method carried out by adding approximately 80 to 150 mL/min of HBr (hydrogen bromide) gas to a mixed gas (total flow rate being 24 mL/min) consisting of $SF_6/O_2/SiF_4$ (sulfur hexafluoride/oxygen/silicon tetrafluoride) to enhance the ion etching performance and to control the trench angle profile to around 90 degrees.

Japanese Patent Application Laid-Open Publication No. 2004-87738 (patent document 2) discloses a dry etching method for processing a trench via a mixed gas plasma using a mixed gas consisting of $SF_6$, $O_2$ and $SiF_4$ to process trenches with an opening diameter or opening width of 3 micrometers or smaller and a depth of 15 micrometers or smaller, or an opening diameter or opening width of 3 micrometers or larger and a depth of 20 micrometers or deeper.

However, according to the above-mentioned prior art performing high-rate etching using mainly fluorine-based gases, the effect of protecting the side walls of the trench is insufficient, and especially when forming a deep trench, the protection of the upper portion of the side walls of the etched trench becomes insufficient while the etching is progressed in the depth direction, causing damages such as recess and roughness to be generated on the surface of the side walls.

That is, considering the embedding process that follows the forming of the trench, the trench must be somewhat tapered, and in that case, the tapered portion of the trench is subjected to damage by the ion bombardment if the ionicity is high. However, there is no consideration on the above problem according to the prior art method disclosed in patent document 1, and since the method carries out etching with high ionicity, the ion bombardment on the inner wall surfaces of the trench may damage the protective layer and generate recesses and surface roughness on the side walls.

Further, according to the prior art method disclosed in patent document 2, there is no disclosure on an etching method related to processing a trench with a small opening (under 3 micrometers) and a deep hole (over 20 micrometers) with a high aspect ratio. Since the etching method for a trench having a high aspect ratio is not established according to patent document 2, the protections on the upper portion of the side walls of the trench having completed etching becomes insufficient, and the side walls are damaged at the end of the etching process.

SUMMARY OF THE INVENTION

The object of the present invention is to provide an etching method and an etching apparatus capable of etching a trench without causing any damages, such as recess and surface roughness, on the side wall surface of the trench while maintaining a high-etching rate.

The object of the present invention is realized by carrying out plasma etching for forming a silicon trench to create a groove or a hole to a silicon substrate or a silicon substrate having a silicon oxide dielectric layer, the etching performed via a plasma generated by a mixed gas containing hydrogen formed by adding a gas containing hydrogen to a mixed gas composed of $SF_6$ and $O_2$ or a mixed gas composed of $SF_6$, $O_2$ and $SiF_4$, wherein the amount of added gas containing hydrogen is within a range of 5 to 16% (percent concentration) of the total gas flow rate of said mixed gas.

According to the present invention, a trench profile having no side wall damage can be formed while maintaining a high-etching rate, that is, while maintaining throughput. Furthermore, since the protection of the side walls of the trench is realized by adding gas containing a small amount of H (hydrogen), the rapid increase of reaction byproducts attaching to the inner walls of the chamber can be disregarded, and the inside of the chamber can maintain a clean condition.

DETAILED DESCRIPTION OF THE PREFERRED EMBODIMENTS

The preferred embodiments for carrying out the present invention will be described in detail with reference to the drawings.

Embodiment 1

Figure 1:
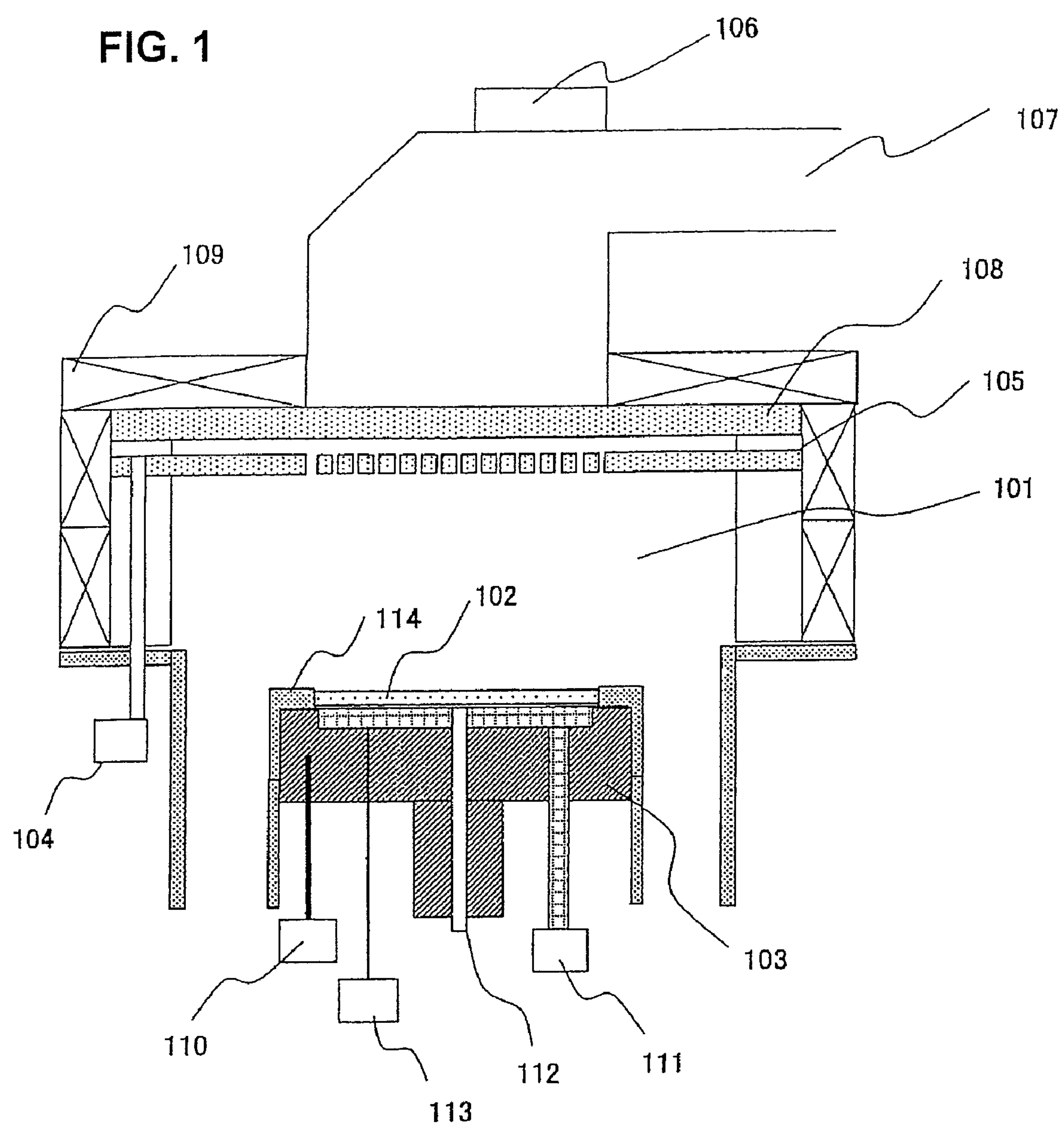
FIG. 1 shows a microwave plasma etching equipment according to the present invention.

FIG. 1 shows a microwave plasma etching equipment according to embodiment 1 of the present invention utilizing microwaves and magnetic fields as means for generating plasma.

In the present equipment, etching gas is supplied to an etching processing chamber 101 from a gas supply means 104 via a permeation window 105 having a porous structure made of quartz, for example.

Further, microwaves generated from a microwave generator (not shown) are transmitted via a matching box 106 and a waveguide 107 and through a microwave introduction window 108 into the etching processing chamber 101 to turn the above-mentioned etching gas into plasma.

In order to enhance the radiation efficiency, a solenoid coil 109 for generating magnetic fields is disposed around the etching chamber, a magnetic field of 0.0875 T is generated, and high-density plasma is generated by the magnetic field utilizing electron cyclotron resonance. A sample stage 103 is disposed in the etching chamber 101, on which a substrate to be processed 102 is placed, which is subjected to etching by gas plasma generated via microwaves. A high-frequency power source 113 is connected to the sample stage 103 for placing the object to be processed, which is designed to apply a high frequency bias in the range of 400 kHz to 13.56 MHz. A static adsorption force is generated on the surface of the sample stage 103 by applying DC voltage through a static adsorption power source 110, and the substrate 102 to be processed is attracted to the sample stage 103 via static chuck.

Further, grooves are formed on the surface of the sample stage 103, so that by feeding cooling gas such as He, Ar and $O_2$ from a cooling gas inlet 112 to a flow channel (not shown) defined by the grooves and the back surface of the substrate 102 to be processed fixed thereto, the channel can be maintained at predetermined pressure. The rise of temperature of the surface of the substrate 102 to be processed is transmitted via thermal conduction between the gas in the channel and the contact surface to the surface of the sample stage 103, by which the substrate is maintained at a constant temperature. In order to cool the substrate 102 to be processed to 0 degrees or lower, a coolant having a temperature cooled to a predetermined temperature by a chiller unit 111 is circulated in a coolant circulation channel embedded in the sample stage 103.

An insulating cover 114 made of ceramics or quartz is disposed around the substrate 102 to be processed. The etching gas introduced into the etching chamber 101 is discharged to the exterior of the etching chamber 101 after the etching is completed via an exhaust pump and exhaust pipe not shown.

Next, the actual embodiment of the Si etching method according to the present invention will be described.

In the prior art, an example of a process is illustrated by using the above-described plasma etching equipment to carry out a plasma process primarily using a mixed gas composed of $SF_6$, $O_2$ and $SiF_4$. The detailed structure of the substrate 102 to be processed and the status after the etching is illustrated in FIG. 2.

Figure 2A:
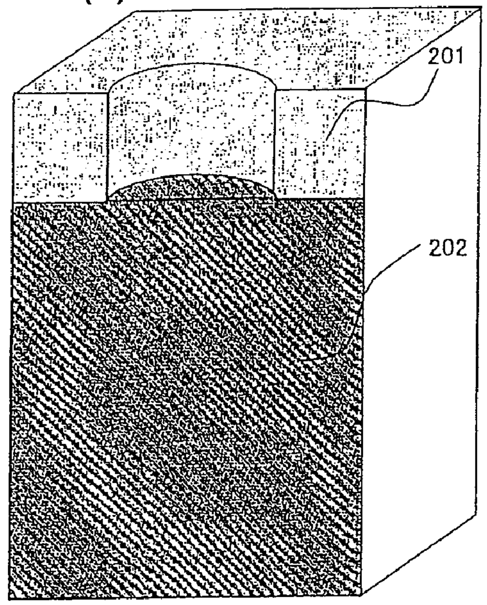
FIG. 2(*a*), FIG. 2(*b*) and FIG. 2(*c*) illustrate a damage generated to the surface of side walls of a Si substrate according to the prior art.
Figure 2B:
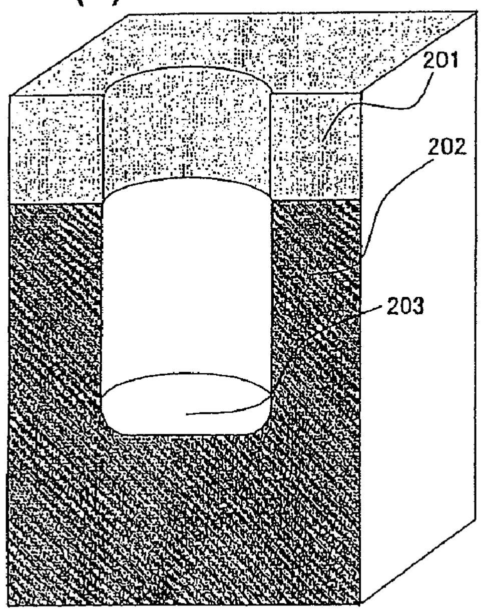
Figure 2C:
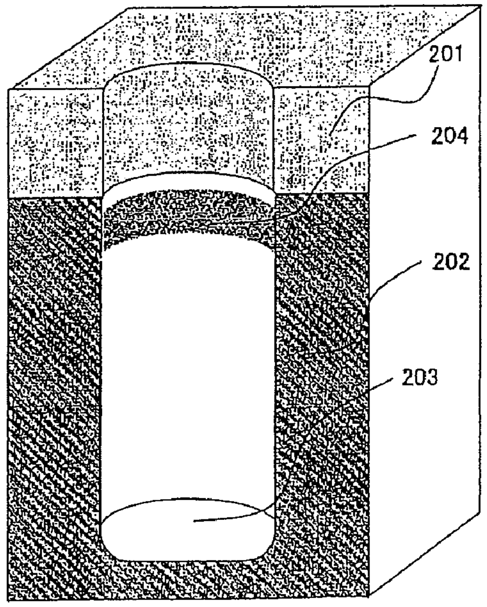

As shown in FIG. 2(*a*), the substrate 202 to be processed is an Si substrate patterned by a mask material 201 consisting of $SiO_2$ or the like, and as shown in FIG. 2(*b*), the substrate is etched through a trench opening 203. In this etching process, the $SF_6$ and $O_2$ gases introduced to the etching chamber 101 are dissociated into ions and radicals of Si, S, F and O, respectively, and SiF and SiO are generated by the reaction with the surface of the substrate 202. The SiF generated during this reaction process and the SiF generated by the dissociation of $SiF_4$ gas lead the etching performed within the trench opening 203.

On the other hand, simultaneously with the progress of the etching within the trench opening 203, an appropriate amount of SiO is formed as a side wall protecting film, by which the isotropic etching by F radicals is suppressed and an anisotropic high-rate etching is enabled. Moreover, since the SiO generated by the reaction of mixed gas composed of $SF_6$ and $O_2$ gases with the silicon in the substrate is deposited as a relatively thin layer on the inner wall of the chamber, only very little contaminants are generated by detached attachments, so the wetting cycle of the chamber can be advantageously elongated.

Furthermore, according to the above explanation, it was necessary that $SiF_4$ was contained in the mixed gas. However, gases such as $SF_6$ and $O_2$ can be used to achieve the objects of the present invention as long as an appropriate amount of SiO is deposited as a side wall protection layer.

As shown in FIG. 2(*b*), if the trench depth is relatively shallow (or when the etching time is short), the side walls of the trench are not damaged, and the etching can be carried out by the present process without any problem. However, if the etching is carried out to a further depth as shown in FIG. 2(*c*), the progress of the etching in the depth direction causes the protection of the side walls to be insufficient, and as a result, a damaged side wall 204 is generated.

According to the present process, it is possible to suppress such damage 204 to the Si surface by reducing the amount of fluorine radicals acting as the etchant, but in that case, the etching in the depth direction is also suppressed, according to which the etch rate is deteriorated or the etching is stopped.

Thus, one example of a process according to the plasma etching method of the present invention will be described with reference to FIG. 3.

Figure 3A:
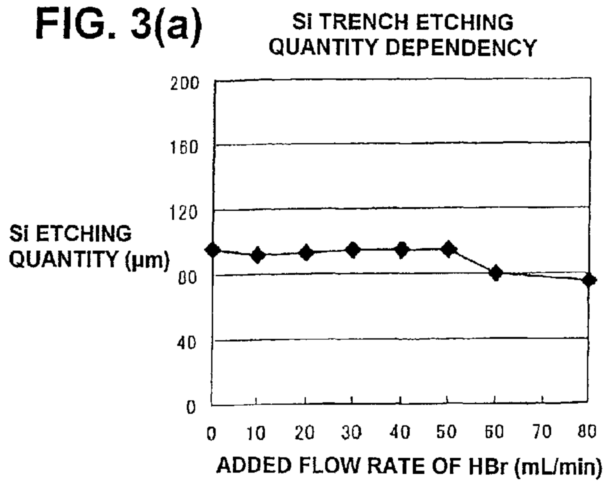
FIG. 3(*a*), FIG. 3(*b*) and FIG. 3(*c*) show dependencies of adding HBr according to the present invention.
Figure 3B:
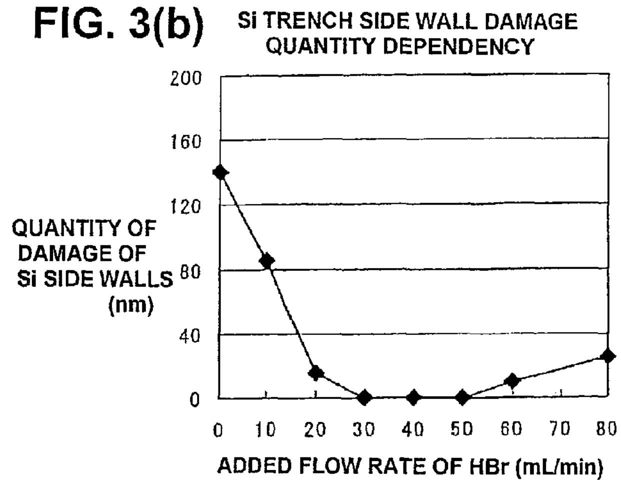
Figure 3C:
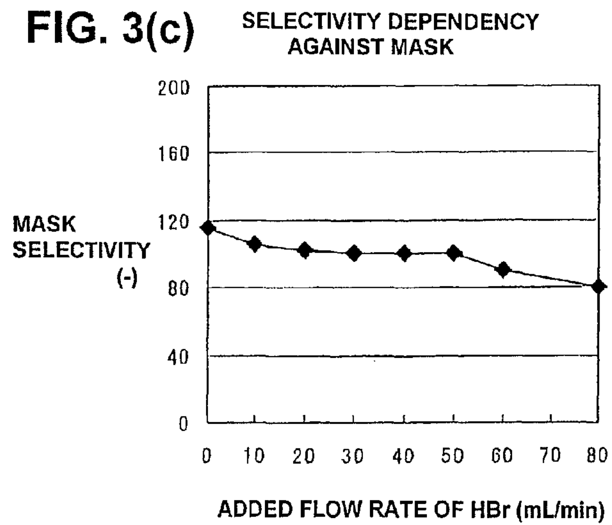

FIG. 3 illustrates the results of trench etching carried out by adding HBr (hydrogen bromide) to the aforementioned etching conditions. As an example, by adding 30 mL/min of HBr to a mixed gas composed of 150 mL/min of $SF_6$, 30 mL/min of $O_2$ and 200 mL/min of $SiF_4$, the surface damage 204 generated to the Si trench was suppressed. In the example, the amount of HBr gas being added is approximately 8% (percent concentration) of the total gas flow rate.

FIG. 3(*a*) illustrates the Si trench etching quantity dependency showing the quantity of etched Si (m) with respect to the added flow rate of HBr (mL/min). When the added flow rate of HBr is relatively small (0 to 50 mL/min), the influence of adding HBr is small and the Si etching quantity is substantially constant (approximately 100 μm), and the etching rate can be maintained. However, when the added flow rate of HBr exceeds 50 mL/min, the Si etching quantity is reduced as the added flow rate of HBr increases, and when the added flow rate of HBr exceeds 60 mL/min, the etching rate is reduced by more than 20% (percent concentration). In this state, the object of the present invention to suppress the damage to the side walls of the Si trench while maintaining a constant etch rate cannot be achieved.

As for the Si trench etching quantity dependency representing the Si etching quantity (μm) with respect to the added flow rate of HBr, similar tendencies are shown when gases containing hydrogen other than HBr, such as HI, HCl, $H_2$, $H_2O$ and $NH_3$, are used, and also when gases having a gas containing hydrogen diluted by Ar, He or $N_2$ as added gas are used, or when gases diluted in advance by the above-mentioned gases are used. In the case of diluted gas, the quantity of gas containing hydrogen prior to dilution is considered as the added quantity.

The amount of HBr being added, or 60 mL/min, according to which the damage to the side walls of the Si trench cannot be suppressed while maintaining the above-mentioned etch rate, corresponds to approximately 16% (percent concentration) of the 380 mL/min of mixed gas composed of 150 mL/min of $SF_6$, 30 mL/min of $O_2$ and 200 mL/min of $SiF_4$.

FIG. 3(*b*) illustrates an Si trench side wall damage quantity dependency, which represents the amount of damage caused to the side walls of the Si with respect to the added flow rate of HBr (mL/min).

When the added flow rate of HBr is small (about 0 mL/min), approximately 140 nm of damage is caused to the Si side walls. However, the amount of damage is reduced by adding HBr, and when the added flow rate of HBr reaches 20 mL/min, the damage is reduced to approximately 15 nm, by which the amount of damage to the side walls of the Si trench is greatly reduced compared to the case where no HBr is added. The added flow rate of HBr, which is 20 mL/min, corresponds to approximately 5% (percent concentration) of the amount of mixed gas, which is 380 mL/min.

When the added flow rate of HBr is increased to exceed 5% (percent concentration) and further gradually increased, the damage to the side walls of the Si trench is reduced, and substantially no damage is caused to the side walls of the Si trench for a while.

When the added flow rate of HBr is even further increased, the damage to the side walls of the Si trench is gradually increased. When the added flow rate of HBr is approximately 60 mL/min (approximately 16% (percent concentration) of the mixed gas), a slight damage occurs to the side walls of the Si trench, but the level of the damage is practically acceptable.

When the added flow rate of HBr exceeds approximately 60 mL/min, a considerable amount of damage is caused to the side walls of the Si trench, which becomes a problem. Further, when the added flow rate of HBr reaches approximately 80 mL/min (21% (percent concentration) of the mixed gas), a considerable amount of damage exceeding the acceptable level occurs to the side walls of the Si trench, by which the object of suppressing damage to the side walls of the Si trench while maintaining the etch rate is no longer realized. This increase of damage to the side walls of the Si trench is considered to be caused by the radical species contributing to the etching (in this case, fluoride) becoming excessive and reacting with the side walls of the Si trench, resulting in the damage to the side walls.

The Si trench side wall damage dependency, which is the amount of damage (nm) caused to the side walls of the Si trench with respect to the added flow rate of HBr, shows a similar tendency when gases containing hydrogen other than HBr, such as HI, HCl, $H_2$, $H_2O$ or $NH_3$, are used, and also when gases having the listed gases containing hydrogen diluted with Ar, He or $N_2$ are used, or when gases being diluted by the aforementioned gases in advance are used. In the case of diluted gas, the quantity of gas containing hydrogen prior to dilution is considered as the added quantity.

FIG. 3(*c*) shows a selectivity dependency against mask, which is the mask selectivity with respect to the added flow rate of HBr. Here, mask selectivity refers to the ratio of the etching rates between the material to be etched (which is silicon in the present example) and the material of the mask (which is $SiO_2$ in the present example). Regarding etching, it is important to carry out etching of the material to be etched without etching the mask material as much as possible. In an extreme case, if the mask selectivity is not good, the mask is removed even before the target etch quantity of the material to be etched is achieved, and the etching cannot be completed. Therefore, it is necessary to retain a high mask selectivity.

With reference to FIG. 3(*c*), the mask selectivity is gradually decreased in correspondence to the added flow rate of HBr. With respect to the mixed gas, the mask selectivity ratio is sufficiently high when the added flow rate of HBr is within the range of approximately 5% (percent concentration) to 16% (percent concentration).

As for the selectivity dependency against mask which is the mask selectivity with respect to the added flow rate of HBr, a similar result is achieved when gases containing hydrogen other than HBr, such as HI, HCl, $H_2$, $H_2O$ or $NH_3$, are used, and also when gases having the above-mentioned gases diluted with Ar, He or Ne are used, or when gases being diluted with the above-mentioned gases in advance are used.

As described, it is recognized from FIG. 3 that when the added ratio of HBr is 5% (percent concentration) or less, the effect of suppressing damage to the side walls of the Si cannot be achieved. This is considered to be because there is not enough supply of depositing reaction products having side wall protecting effects. Moreover, if the added amount of HBr is 16% (percent concentration) or greater, then the generation of reaction products having side wall protecting effects becomes excessive, deteriorating the etching carried out in the depth direction. As a result, the etching ratio of Si is gradually deteriorated, which is simultaneously accompanied by the deterioration of the selectivity ratio against mask. Moreover, when the etching rate in the depth direction is deteriorated, the Br-based etchants also become excessive and the side walls having been protected is subjected to reaction again, and further damage to the side walls of the Si is caused. From these results, it can be concluded that the ratio of addition of HBr should approximately be in the range of 5 to 16% (percent concentration).

Figure 4A:
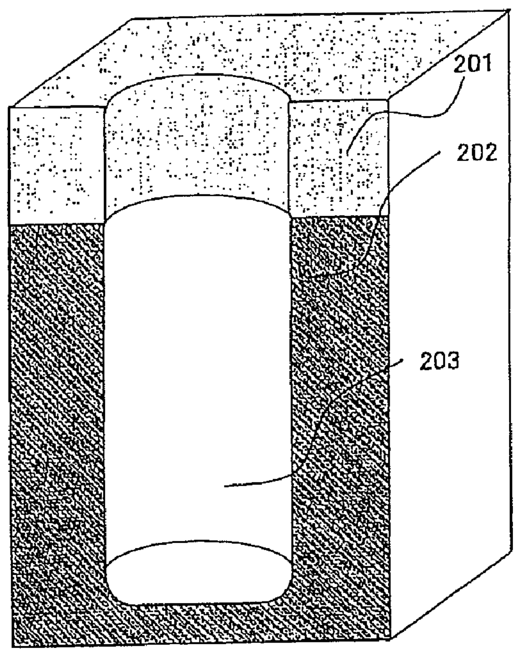
FIG. 4(*a*) and FIG. 4(*b*) show etching profiles obtained by the present invention.
Figure 4B:
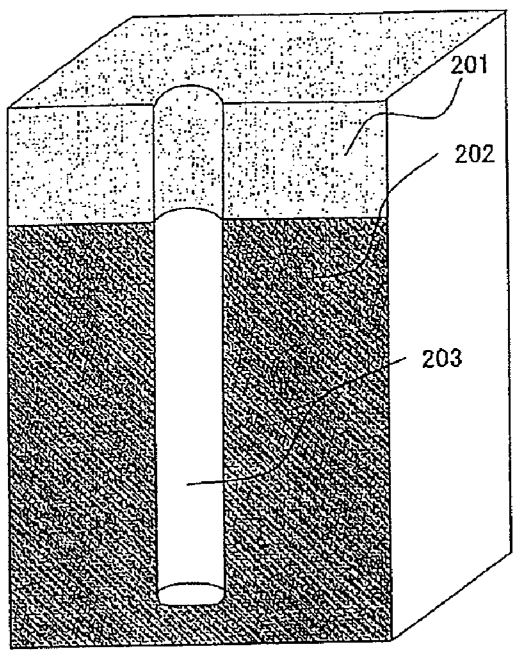

FIG. 4 shows examples of the aforementioned etching profile. In a structure with a relatively small aspect ratio (the aspect ratio, which is the ratio between the diameter of the trench opening 203 formed to the substrate 202 to be processed and the depth, being about 5), as shown in FIG. 4(*a*), an etching profile having no damage caused to the side walls of the trench was achieved. Further, as shown in FIG. 4(*b*), also in a structure with a large aspect ratio (the aspect ratio, which is the ratio between the diameter of the trench opening 203 formed to the substrate 202 to be processed and the depth, being about 7), an etching profile having no damage caused to the side walls of the trench was achieved, and no problems such as etch stops occurred.

Further according to the plasma etching method of the present invention, the deposition probability of the generated deposition components can be improved by reducing the electrode temperature in combination with the above arrangement. This is considered to be the reason why in comparison to the etching process performed in a temperature region equal to or above normal temperature, the present method is capable of carrying out the etching process without causing side wall damages, since the protective layer is formed even under conditions where the amount of reaction byproducts that form the protective layer to the side walls of the trench is small.

The processing conditions shown in Table 1 are typical etching conditions used in the microwave plasma etching equipment with a magnetic field illustrated in FIG. 1. The processing conditions shown here are adjusted for the present invention, and the optimum values of the process factors may somewhat vary in other etching equipments, such as a helicon wave etching equipment, an inductively-coupled plasma etching equipment, a capacitively-coupled plasma etching equipment, or a magnetic field RIE equipment.

TABLE 1

| Typical Etching Conditions of the Present Invention | | |
|---|---|---|
| Items | | Main Etch |
| $SF_6$ flow rate | (ml/min) | 150 |
| $O_2$ flow rate | | 30 |
| $SiF_4$ flow rate | | 200 |
| Microwave | (W) | 800 |
| Processing Pressure | (Pa) | 4.0 |
| RF bias | (W) | 20 |
| Temperature of sample stage | (deg. C.) | −45 |
| Coil current | (A) | 14/14/4 |

The present method for suppressing the damage to the side walls in trench etching is not only applicable to the present equipment, but also applicable to other etching equipments. Based on the processing conditions disclosed above, those familiar to the etching process can easily adjust and optimize the conditions for other equipments.

What is claimed is:

1. An etching method comprising:

etching a trench (a groove) in a silicon substrate patterned by a mask material composed of $SiO_2$ or a silicon substrate having a silicon oxide dielectric layer and patterned by a mask material composed of $SiO_2$, the etching being performed via a plasma generated by a mixed gas formed by adding a HBr gas to a mixed gas composed only of $SF_6$ gas, $O_2$ gas and $SiF_4$ gas, wherein the amount of HBr gas is within a range of 5 to 16% (percent concentration) of the total gas flow rate of said mixed gas composed only of $SF_6$ gas having a flow rate of 150 mL/min, $O_2$ gas having a flow rate of 30 mL/min and $SiF_4$ gas having a flow rate of 200 mL/min, and wherein a temperature of a sample stage for holding the silicon substrate patterned by the mask material composed of $SiO_2$ or the silicon substrate having the silicon oxide dielectric layer and patterned by the mask material composed of $SiO_2$ is controlled to 0° C. or lower.

2. The etching method according to claim 1, wherein the etching is performed using a microwave plasma etching equipment utilizing microwaves and magnetic fields as means for generating a plasma.

* * * * *